US012713552B2

(12) United States Patent
Chiu et al.

(10) Patent No.: US 12,713,552 B2
(45) Date of Patent: Aug. 18, 2026

(54) QUICK-RELEASE MECHANISM EQUIPPED SUPPORT DEVICE

(71) Applicant: Nan Juen International Co., Ltd., Taoyuan City (TW)

(72) Inventors: I-hsiang Chiu, Taoyuan City (TW); Jia-Hung Tsai, Taoyuan City (TW); Kuo-Chih Huang, Taoyuan City (TW); Yi-Tian Li, Taoyuan City (TW)

(73) Assignee: Nan Juen International Co., Ltd., Taoyuan City (TW)

( * ) Notice: Subject to any disclaimer, the term of this patent is extended or adjusted under 35 U.S.C. 154(b) by 22 days.

(21) Appl. No.: 18/923,712

(22) Filed: Oct. 23, 2024

(65) Prior Publication Data

US 2026/0052639 A1 Feb. 19, 2026

(30) Foreign Application Priority Data

Aug. 19, 2024 (TW) ................................ 113131270

(51) Int. Cl.
*H05K 7/14* (2006.01)

(52) U.S. Cl.
CPC .................................. *H05K 7/1489* (2013.01)

(58) Field of Classification Search
CPC ..... H05K 7/1401; H05K 7/1489; A47B 88/43
See application file for complete search history.

(56) References Cited

U.S. PATENT DOCUMENTS

| | | | | |
|---|---|---|---|---|
| 8,408,506 B2 * | 4/2013 | Yu | H05K 7/1489 248/220.22 |
| 9,743,550 B2 * | 8/2017 | Byargeon | F16B 2/18 |
| 10,251,482 B2 * | 4/2019 | Chen | A47B 96/07 |
| 10,278,498 B2 * | 5/2019 | Chen | A47B 88/483 |
| 10,342,336 B2 * | 7/2019 | Chen | A47B 57/545 |
| 10,420,420 B2 * | 9/2019 | Chen | A47B 88/43 |
| 10,602,637 B2 * | 3/2020 | Chen | A47B 88/483 |
| 10,736,420 B2 * | 8/2020 | Chen | A47B 57/38 |
| 10,765,207 B2 * | 9/2020 | Chen | H05K 7/1489 |
| 10,806,255 B1 * | 10/2020 | Chen | A47B 88/443 |
| 10,999,950 B2 * | 5/2021 | Lu | H05K 7/1489 |
| 11,647,836 B2 * | 5/2023 | Chen | A47B 57/32 211/162 |
| 11,980,290 B2 * | 5/2024 | Yang | A47B 96/1408 |
| 2004/0108427 A1 * | 6/2004 | Chen | A47B 88/43 312/334.44 |
| 2009/0261699 A1 * | 10/2009 | Yu | A47B 88/43 312/334.46 |
| 2014/0070064 A1 * | 3/2014 | Chen | H05K 7/1489 248/221.11 |

* cited by examiner

*Primary Examiner* — Ko H Chan

(57) ABSTRACT

A quick-release mechanism equipped support device includes an adapter plate, a fixing member and a quick-release mechanism. The fixing member is placed on the adapter plate. The fixing member is located between a preset rack and the quick-release mechanism. The quick-release mechanism allows the support device to be easily installed and removed from the preset rack.

4 Claims, 20 Drawing Sheets

QUICK-RELEASE MECHANISM EQUIPPED SUPPORT DEVICE

BACKGROUND OF THE INVENTION

1. Field of the Invention

The present invention relates to a quick-release mechanism equipped support device, in particular to a support device adapted for a rack of an industrial server, which is arranged on an adapter plate through a quick-release mechanism for simple disassembly and assembly.

2. Description of the Related Art

In a rack system, the load is usually mounted to the rack holes using a slide rail assembly. Rack systems such as the EIA rack of the Electronic Industries Alliance (EIA) and the OCP rack of the Open Compute Project (OCP), the connector of the EIA rack and the connector of the slide rail assembly are connected to each other, the hole position of the OCP rack and the side of the adapter plate are connected to each other through a fastener, or the hole position of the OCP rack and the side of the rail are connected to each other through a fastener.

However, the slide rail assembly removed from the EIA rack cannot be installed on the OCP rack through the connector. The rail assembly or the rail assembly and its mounted load on the EIA rack need to be removed and moved to the OCP rack for installation. How to install the slide rail assembly removed from the EIA rack on the OCP rack has become an issue that cannot be ignored. Therefore, how to solve the problem of easy disassembly and assembly applicable to both rack systems is the direction that the relevant industry players are eager to research and improve.

SUMMARY OF THE INVENTION

The present invention provides a quick-release mechanism equipped support device, especially one that docks with a preset rack.

The technical means adopted by the present invention includes: an adapter plate, a quick-release mechanism, and a fixing member. The adapter plate is provided with a hollow portion. The quick-release mechanism comprises: a stop member having a first operating portion aligned with the hollow portion and movably disposed on the adapter plate; and a fastener pivotally connected to the adapter plate and adjacent to the stop member. The fixing member is located on the adapter plate between the preset rack and the quick-release mechanism. The stop member is displaced in a first direction by force, and the fastener and the stop member are connected to each other, allowing the fastener to connect with the preset rack for positioning. The stop member is displaced in a second direction by force, and the fastener and the stop member are disengaged from each other and released from the preset rack.

Preferably, another quick-release mechanism, another hollow portion and another fixing member are further provided at one end of the adapter plate, and the other quick-release mechanism is located between the other hollow portion and the other fixing member.

Preferably, a second operating portion and at least one bending portion are respectively disposed on two sides of the fastener, the second operating portion is aligned with the hollow portion, the second operating portion is subjected to force to allow the fastener to deflect relative to the adapter plate, and the at least one bending portion is movable to form a positioning or release positioning with a preset rack.

Preferably, the adapter plate further has at least one stopper, and the stop member has at least one stop groove for the at least one stopper to pass through, and the at least one stopper abuts against two ends of the at least one stop groove to allow displacement of the stop member.

Preferably, the stop member further has a positioning member, and the fastener further has a groove. When the positioning member and the groove are engaged with each other, the fastener is positioned relative to the adapter plate and cannot be deflected. When the positioning member and the groove are separated from each other, the fastener pivots relative to the adapter plate.

Another technical means adopted by the present invention includes: an adapter plate, a fixing member, a front bracket, and a quick-release mechanism. The adapter plate has a hollow portion and a first end and a second end. The second end is mounted with a mounting member. The fixing member is set on the adapter plate. The front bracket covers the first end of the adapter plate and is displaced relative to the adapter plate. The front bracket is connected to another mounting member away from the first end of the adapter plate. The quick-release mechanism includes: a stop member, which is movably mounted on the adapter plate; and a fastener, which is pivotally connected to the adapter plate and deflects to engage or disengage with the stop member. The mounting member and another mounting member are used to assemble a preset slide rail assembly. The front bracket is displaced relative to the adapter plate to adjust the length to accommodate preset slide rail assemblies of different lengths.

Preferably, the adapter plate further has at least one locking member, and the front bracket has at least one rail groove for the at least one locking member to penetrate, so that the front bracket can be moved relative to the adapter plate to a predetermined position to be locked and positioned.

Preferably, the front bracket has an opening aligned with the hollow portion, and a second operating portion and at least one bending portion are respectively provided on both sides of the fastener. The second operating portion is opposite to the hollow portion. The second operating portion is subjected to force to deflect the fastener relative to the adapter plate, and the at least one bending portion is movable to form or release positioning with the preset rack.

Preferably, the quick-release mechanism has an elastic member disposed between the fastener and the adapter plate and providing an elastic force to deflect the fastener relative to the adapter plate, and another quick-release mechanism, another hollow portion and another fixing member are further disposed at one end of the adapter plate, and the other quick-release mechanism is located between the other hollow portion and the other fixing member.

DETAILED DESCRIPTION OF THE PREFERRED EMBODIMENT

Figure 1A:
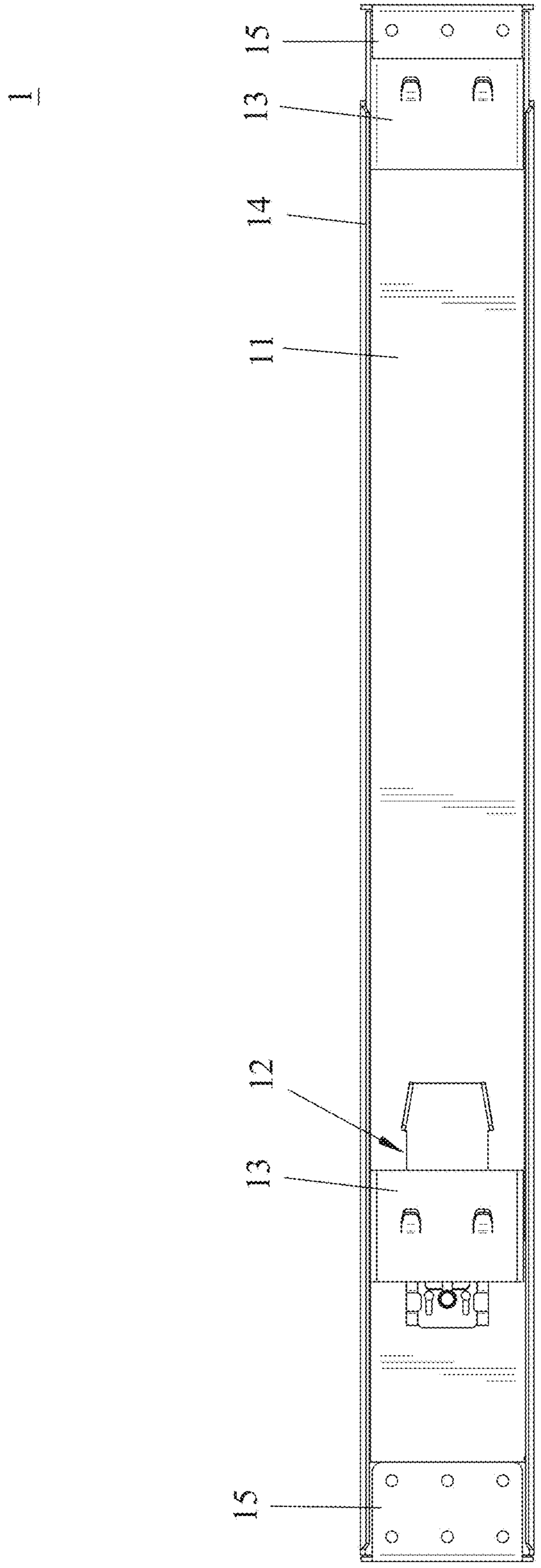
FIG. 1A and FIG. 1B are three-dimensional schematic diagrams of the support device of the present invention.
Figure 1B:
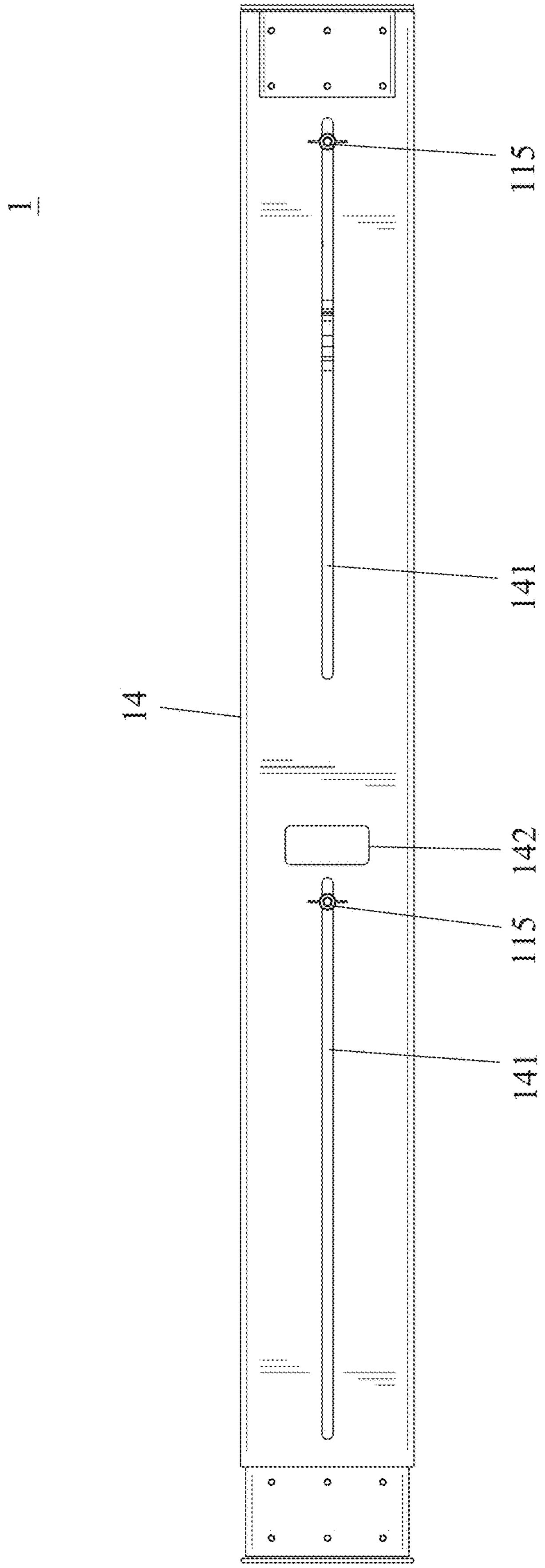

Referring to FIGS. 1A, 1B, 14A and 15, the present invention provides a support device 1 having a quick-release mechanism, the support device 1 comprising an adapter plate 11, a quick-release mechanism 12, a fixing member 13, a front bracket 14 and a mounting member 15. The quick-release mechanism 12 is disposed on the adapter plate 11. The fixing member 13 is disposed on the adapter plate 11. The front bracket 14 covers one side of the adapter plate 11, and the front bracket 14 can be displaced relative to the adapter plate 11. The support device 1 is docked and positioned on a rack 2. The rack 2 has a column 21. The column 21 has a column hole 211. The quick-release mechanism 12 is located between the column 21 and the adapter plate 11. The adapter plate 11 is assembled on the column 21 through the fixing member 13, and the mounting member 15 and another mounting member 15 are respectively assembled to the two ends of a slide rail assembly 16.

The slide rail assembly 16 may be composed of a first rail, a second rail and a third rail. Its structure, displacement, expansion and retraction are already known in the art and will not be further described for the sake of brevity.

The present invention is described in detail by using the fixing member 13 and the adapter plate 11 for bolting. However, the fixing member 13 may be integrally formed with the adapter plate 11, or the fixing member 13 and the adapter plate 11 may be assembled by riveting, snapping, expanding, welding, locking, clamping or hot melting. The embodiments are not intended to limit the patent scope of the present invention.

Figure 2:
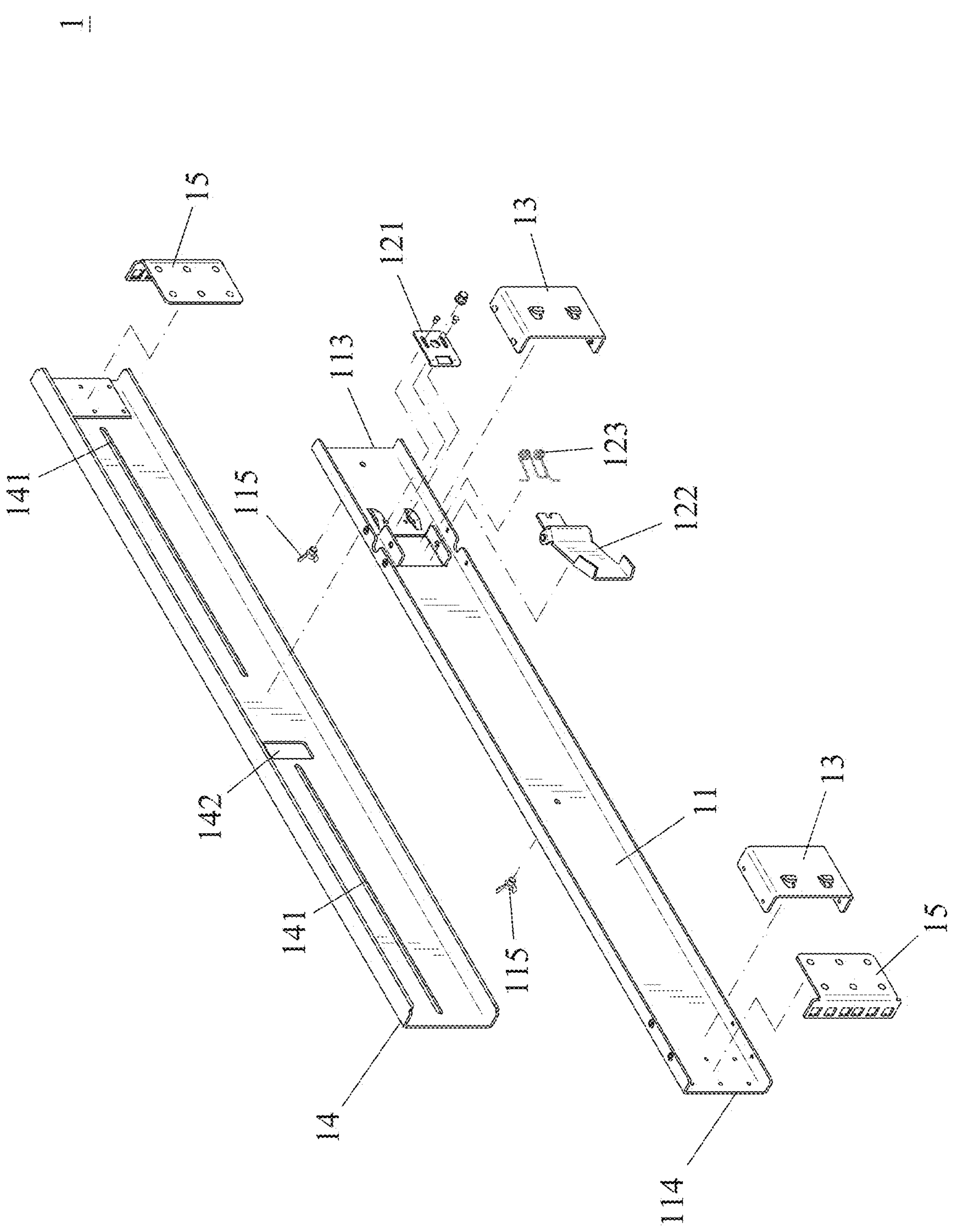
FIG. 2 is an exploded schematic diagram of the support device of the present invention.
Figure 3:
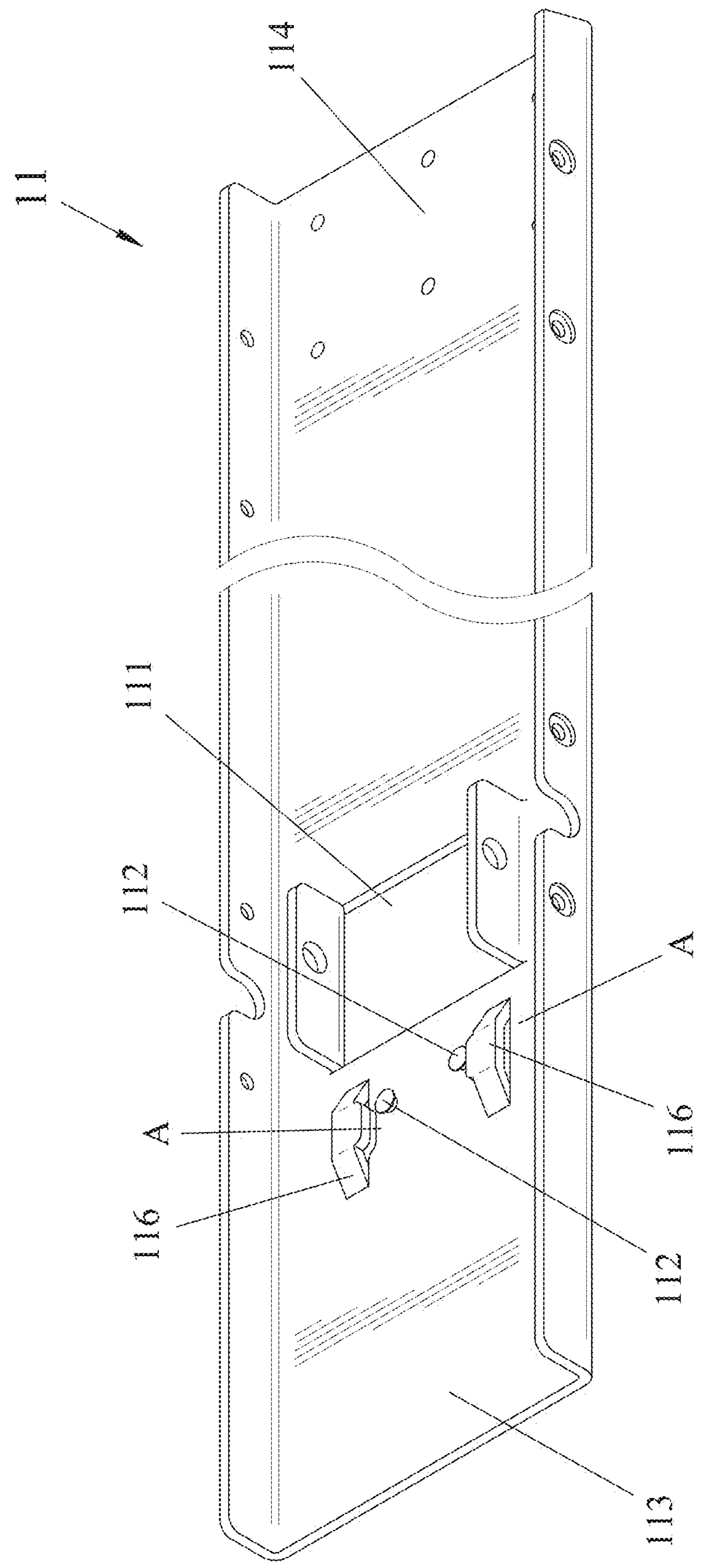
FIG. 3 is a three-dimensional schematic diagram of the adapter plate of the support device of the present invention.
Figure 4:
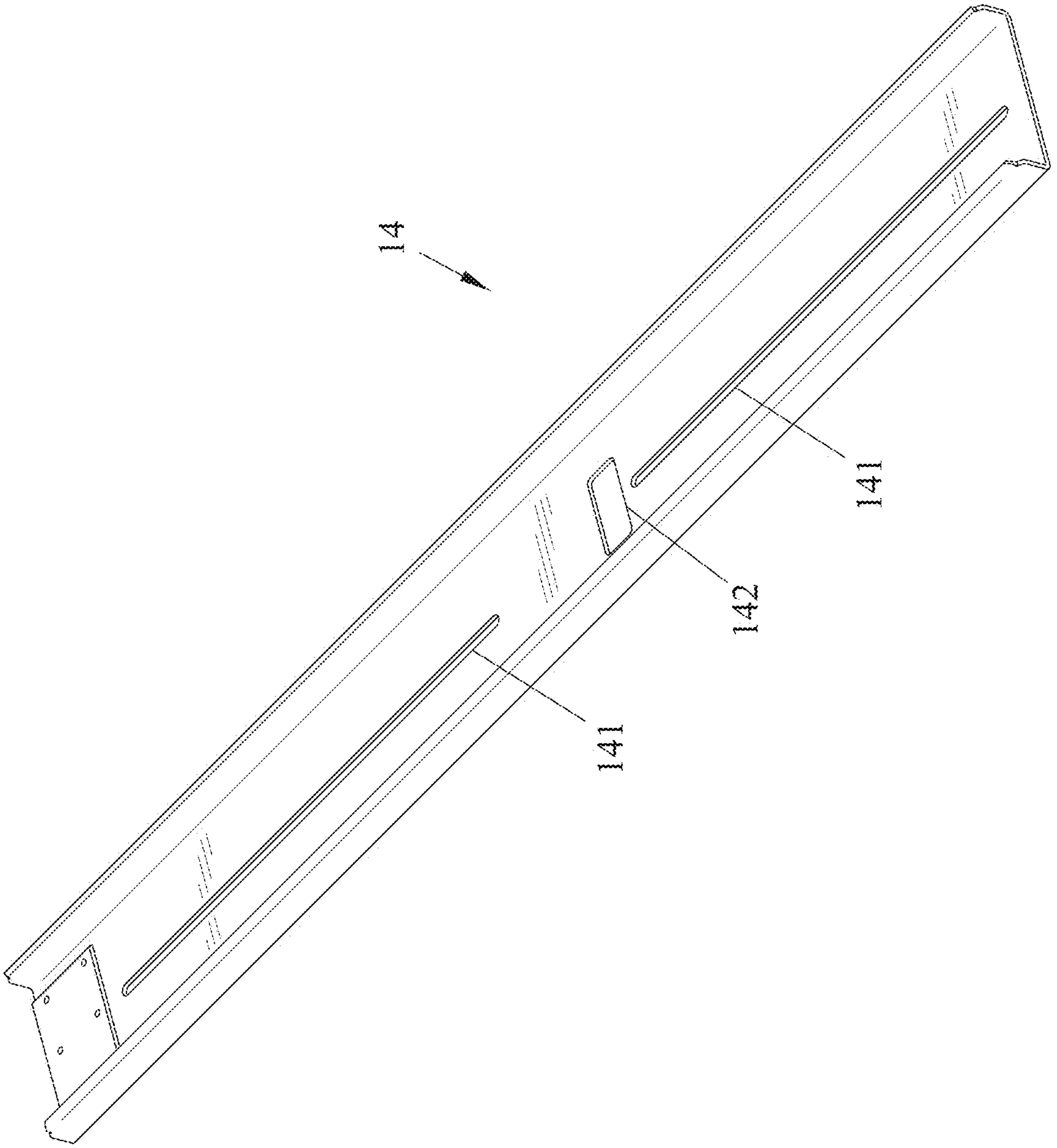
FIG. 4 is a three-dimensional schematic diagram of the front bracket of the support device of the present invention.

Referring to FIGS. 2 to 4, a hollow portion 111 is formed in the adapter plate 11, and the adapter plate 11 has at least one stopper 112, a first end 113, a second end 114, at least one locking member 115, and at least one position-limiting portion 116. The at least one stopper 112 is adjacent to the hollow portion 111. The first end 113 and the second end 114 are located at opposite sides of the adapter plate 11. The second end 114 is mounted with one mounting member 15. The front bracket 14 covers one side of the first end 113 of the adapter plate 11. The front bracket 14 is connected to another mounting member 15 at one end away from the second end 114 of the adapter plate 11. The front bracket 14 has at least one rail groove 141 for the at least one locking member 115 to pass through. The at least one position-limiting portion 116 is disposed on the adapter plate 11, and at least one position-limiting portion 116 is located at a side A of the at least one stopper 112 relative to the hollow portion 111. The front bracket 14 has an opening 142 aligned with the hollow portion 111.

Figure 5:
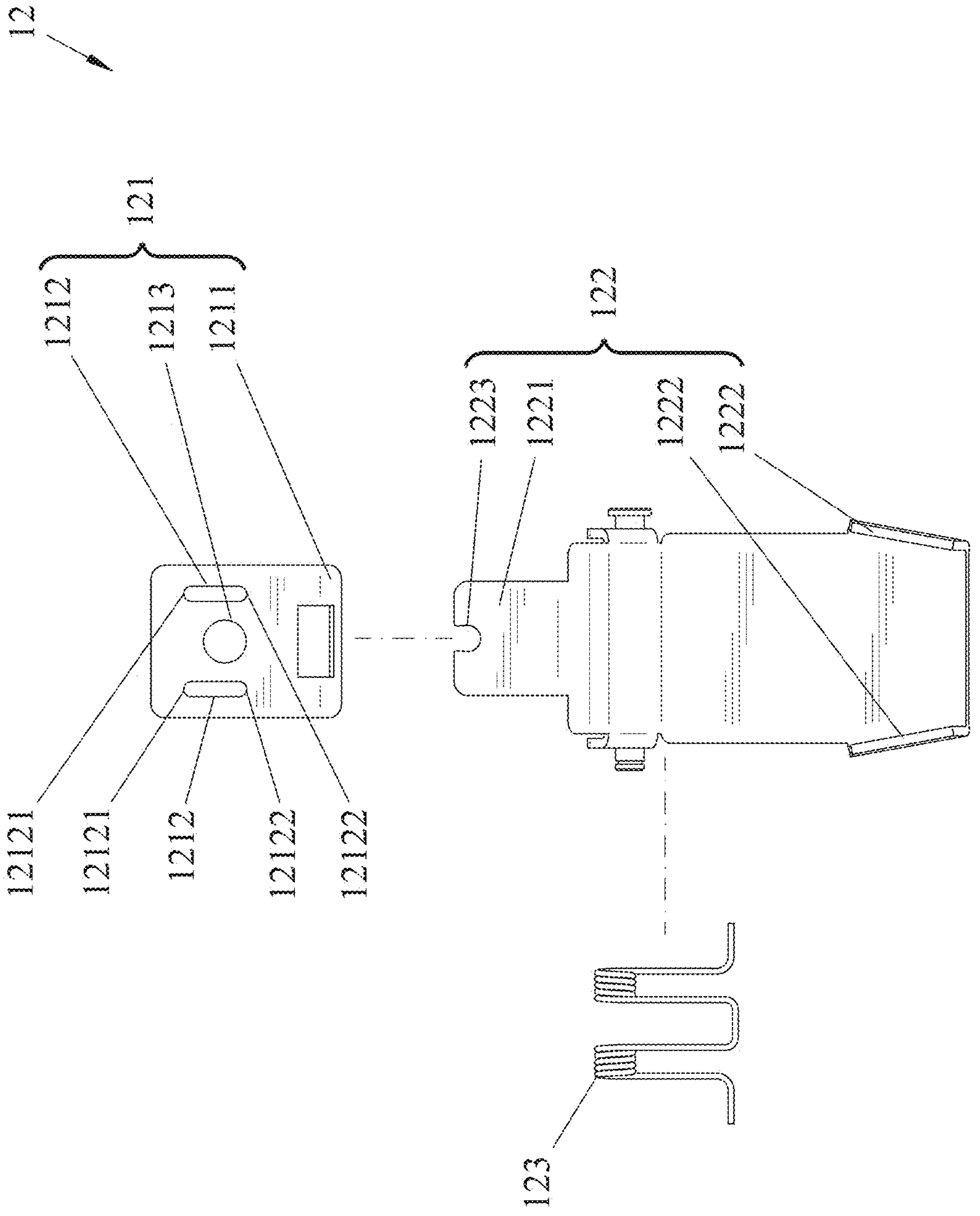
FIG. 5 is an exploded schematic diagram of the quick-release mechanism of the support device of the present invention.
Figure 6A:
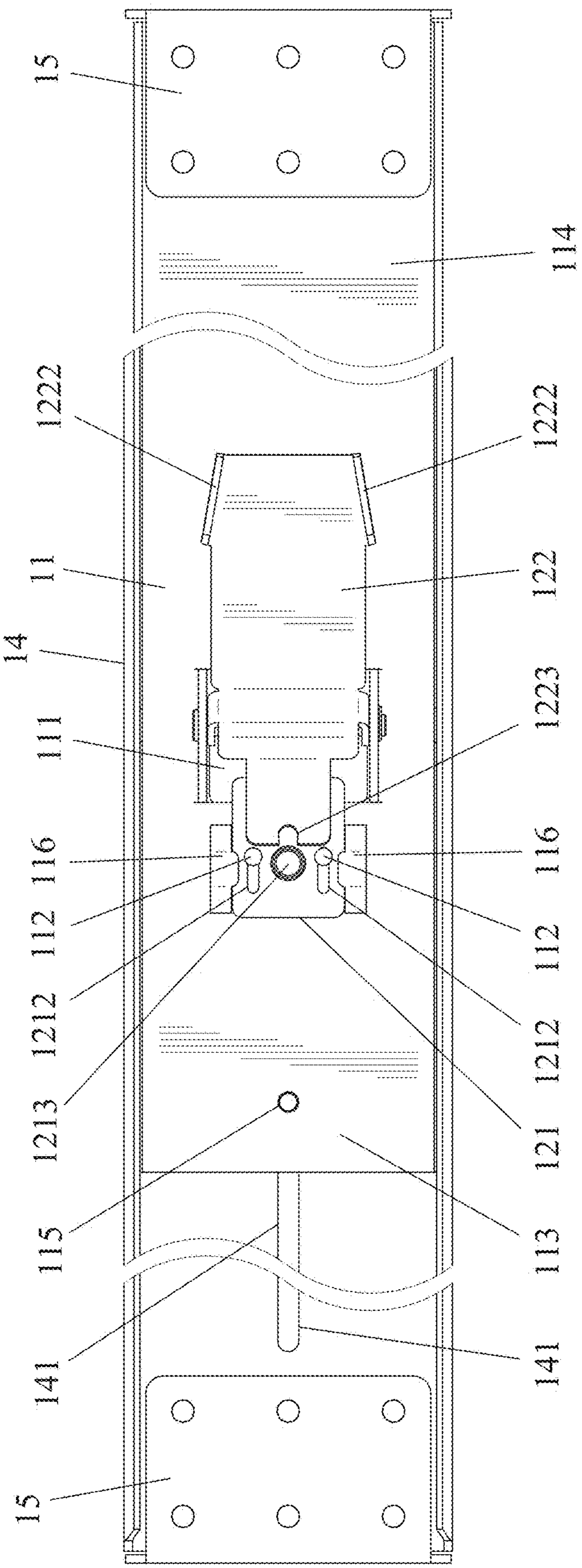
FIGS. 6A and 6B are partial schematic diagrams of the quick-release mechanism of the support device of the present invention located between the column and the adapter plate.
Figure 6B:
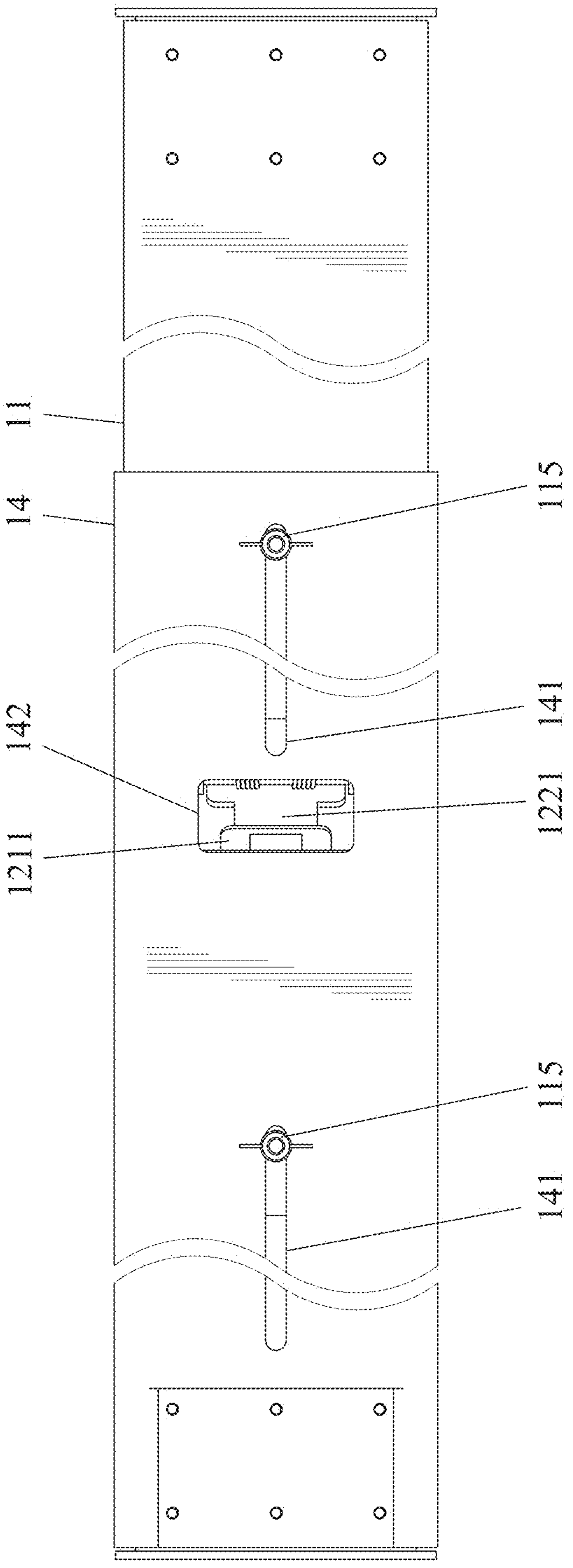

Referring to FIGS. 5 to 6B, the quick-release mechanism 12 includes a stop member 121, a fastener 122, and an elastic member 123. The stop member 121 is movably disposed on the adapter plate 11, and one side of the stop member 121 is located within at least one position-limiting portion 116. The fastener 122 is connected to adapter plate 11, and the fastener 122 is adjacent to the stop member 121. The elastic member 123 is disposed between the fastener 122 and the adapter plate 11. The stop member 121 comprises a first operating portion 1211, at least one stop groove 1212 and a positioning member 1213. The first operating portion 1211 is aligned with the hollow portion 111. The stop member 121 has at least one stop groove 1212 for the at least one stopper 112 to pass through. The fastener 122 comprises a second operating portion 1221, at least one bending portion 1222 and a groove 1223. The fastener 122 has the second operating portion 1221 and the at least one bending portion 1222 on opposite sides thereof. The second operating portion 1221 is aligned with the hollow portion 111. The fastener 122 is provided with the groove 1223 on one side of the second operating portion 1221 away from the at least one bending portion 1222.

Please refer to FIG. 7 to FIG. 11, in which when the support device 1 is detached from the rack 2, a force is applied to the first operating portion 1211 of the stop member 121 to displace it in a first direction D1. The stop member 121 moves relative to the adapter plate 11 and is guided by two position-limiting portions 116. The stop member 121 moves to the at least one stopper 112 and abuts against one end 12121 of the at least one stop groove 1212, so that the stop member 121 stops moving relative to the adapter plate 11. The stop member 121 and the fastener 122 are disengaged from each other, and the positioning member 1213 and the groove 1223 are disengaged from each other. A force F1 is applied to the second operating portion 1221 of the fastener 122 to pivot the fastener 122 relative to the adapter plate 11, and the fastener 122 presses the elastic member 123 to generate elastic deformation. The at least one bending portion 1222 is disengaged from the outer surface of the column 21 of the rack 2 to release the positioning, so that the fixing member 13 can be pushed away from the column hole 211.

Please refer to FIG. 7, FIG. 10, FIG. 12 and FIG. 13 simultaneously, wherein when the support device 1 is installed on the rack 2, the support device 1 is first connected to the column hole 211 through the fixing member 13, the second operating portion 1221 of the fastener 122 stops applying the force F1, and the elastic member 123 elastically returns to push the fastener 122 to pivot. The at least one bending portion 1222 abuts against the outer surface of the column 21 of the rack 2, and the at least one bending portion 1222 abuts against the column 21 of the rack 2 to form a position. Apply force to the first operating portion 1211 again to move in a second direction D2, and the stop member 121 moves to the at least one stopper 112 against the other end 12122 of the at least one stop groove 1212, so that the stop member 121 stops moving relative to the adapter plate 11 again. The positioning member 1213 and the groove 1223 are engaged with each other, so that the fastener 122 cannot pivot relative to the adapter plate 11. The adapter plate 11 is assembled on the column 21 of the rack 2 through the quick-release mechanism 12 and the fixing member 13 and cannot be separated.

The present invention is described with two position-limiting portions 116 as an example. The at least one position-limiting portions 116 may be three, four or five. The example is not intended to limit the patent scope of the present invention.

Figure 14A:
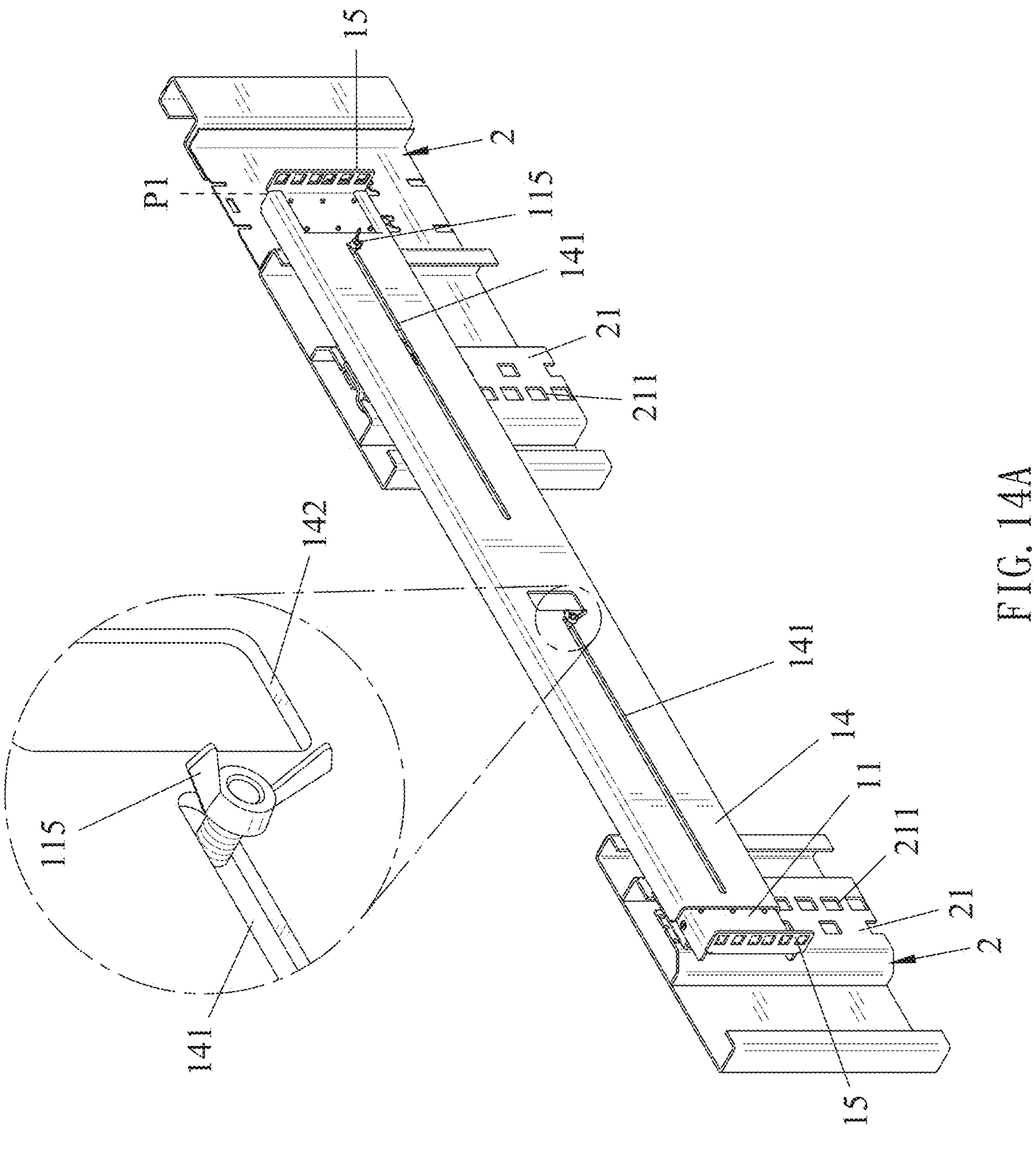
FIG. 14A and FIG. 14B are schematic diagrams showing the locking and unlocking of the front bracket relative to the adapter plate of the present invention.
Figure 14B:
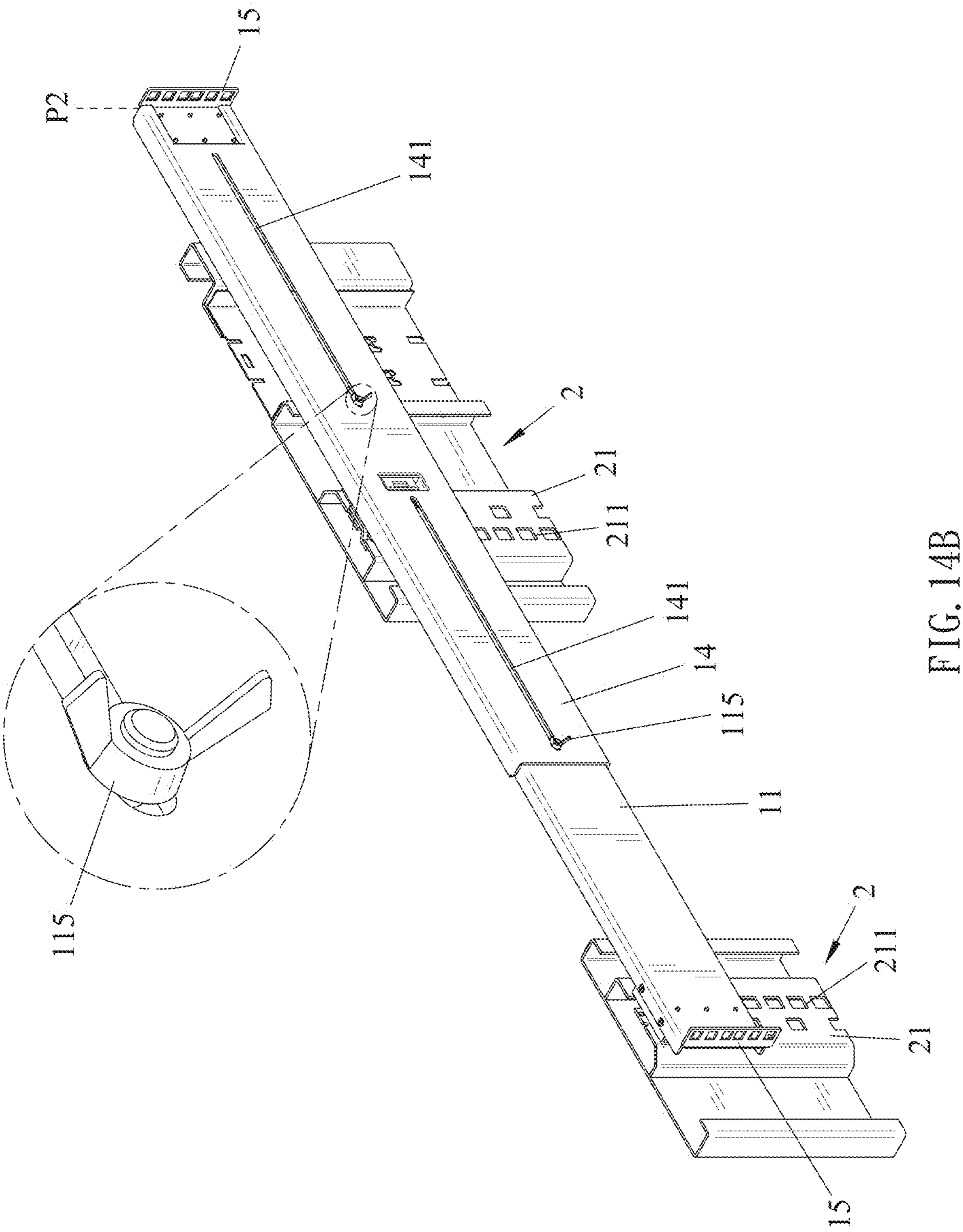
Figure 15:
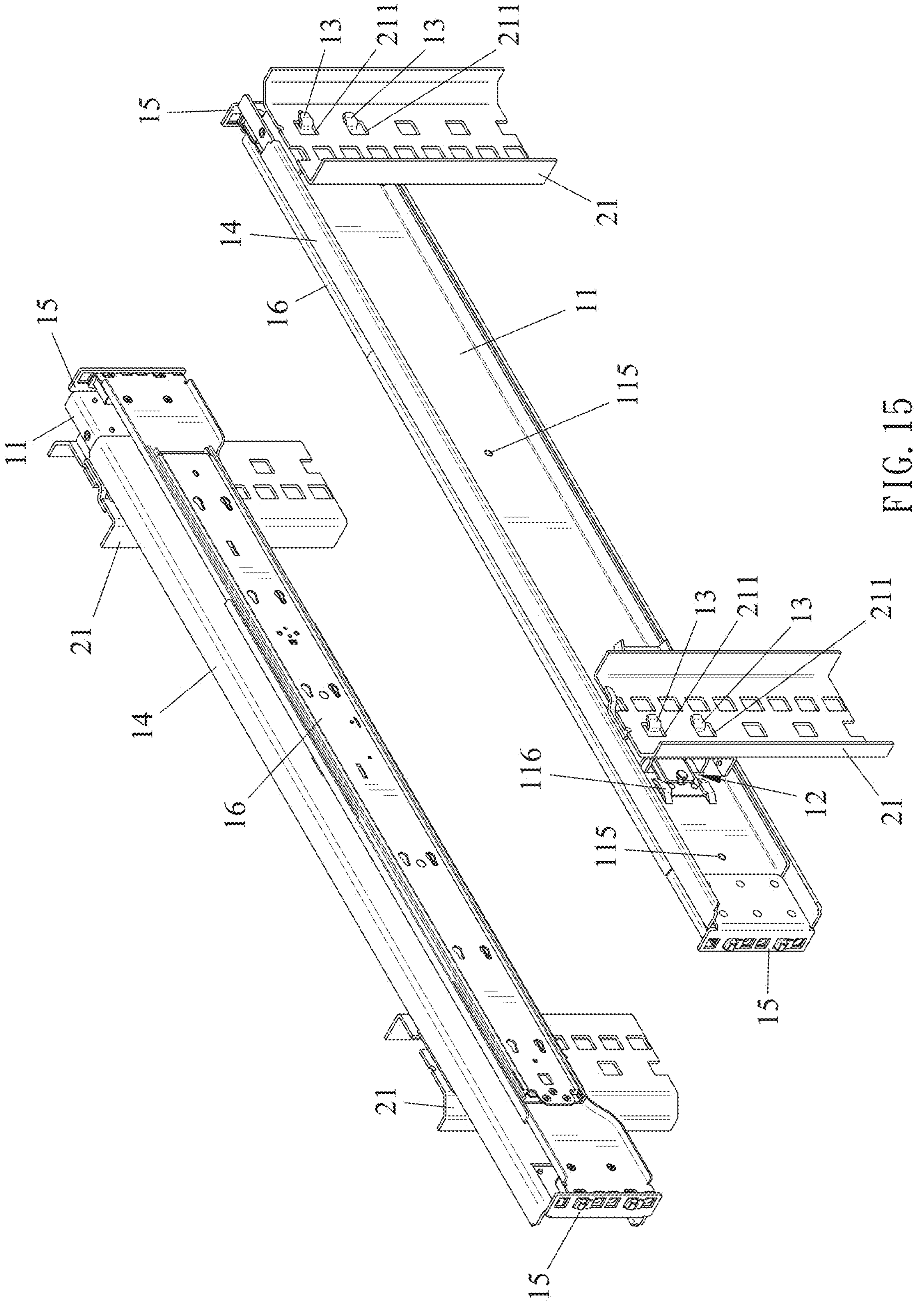
FIG. 15 is a three-dimensional schematic diagram of a support device installing a slide rail assembly according to the first embodiment of the present invention.

Please refer to FIG. 14A to FIG. 15, in which when the locking member 115 is loosened by force, the front bracket 14 is in an unlocked state relative to the adapter plate 11. At this time, the front bracket 14 can be adjusted relative to the adapter plate 11. The locking member 115 is relatively displaced in the at least one rail groove 141, and after moving from a folded position P1 to a predetermined position P2, the locking member 115 is tightened by force, so that the front bracket 14 is locked relative to the adapter plate 11. At this time, the front bracket 14 cannot be displaced and adjusted relative to the adapter plate 11, and the slide rail assembly 16 can be assembled on the mounting member 15 of the front bracket 14 and the other mounting member 15 of the adapter plate 11.

Figure 7:
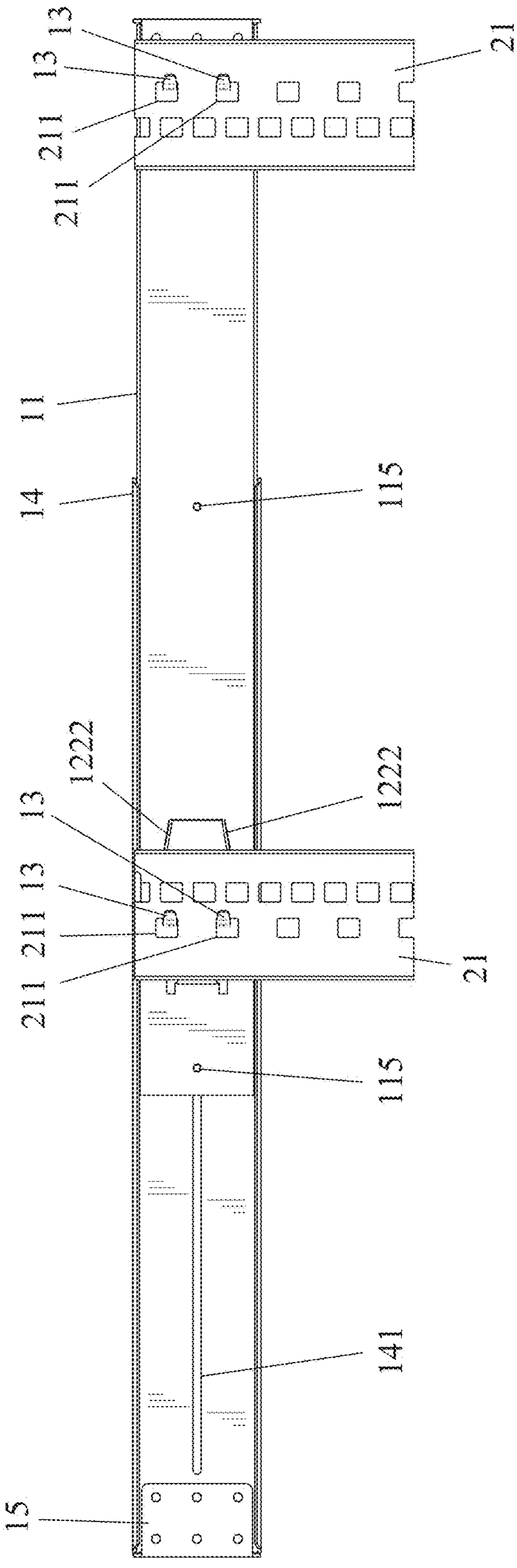
FIG. 7 is a three-dimensional schematic diagram of the support device of the present invention installed on a rack.
Figure 8:
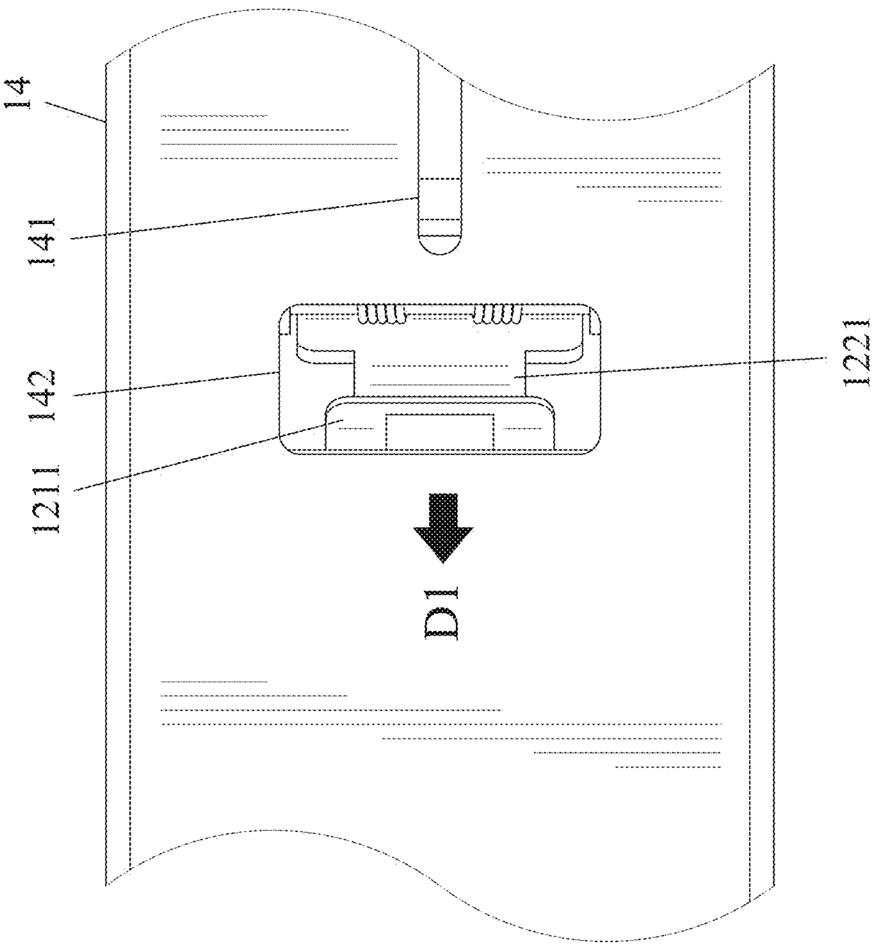
FIG. 8, FIG. 9, FIG. 10, and FIG. 11 are schematic diagrams showing the operation of the support device of the present invention being removed from the rack.
Figure 9:
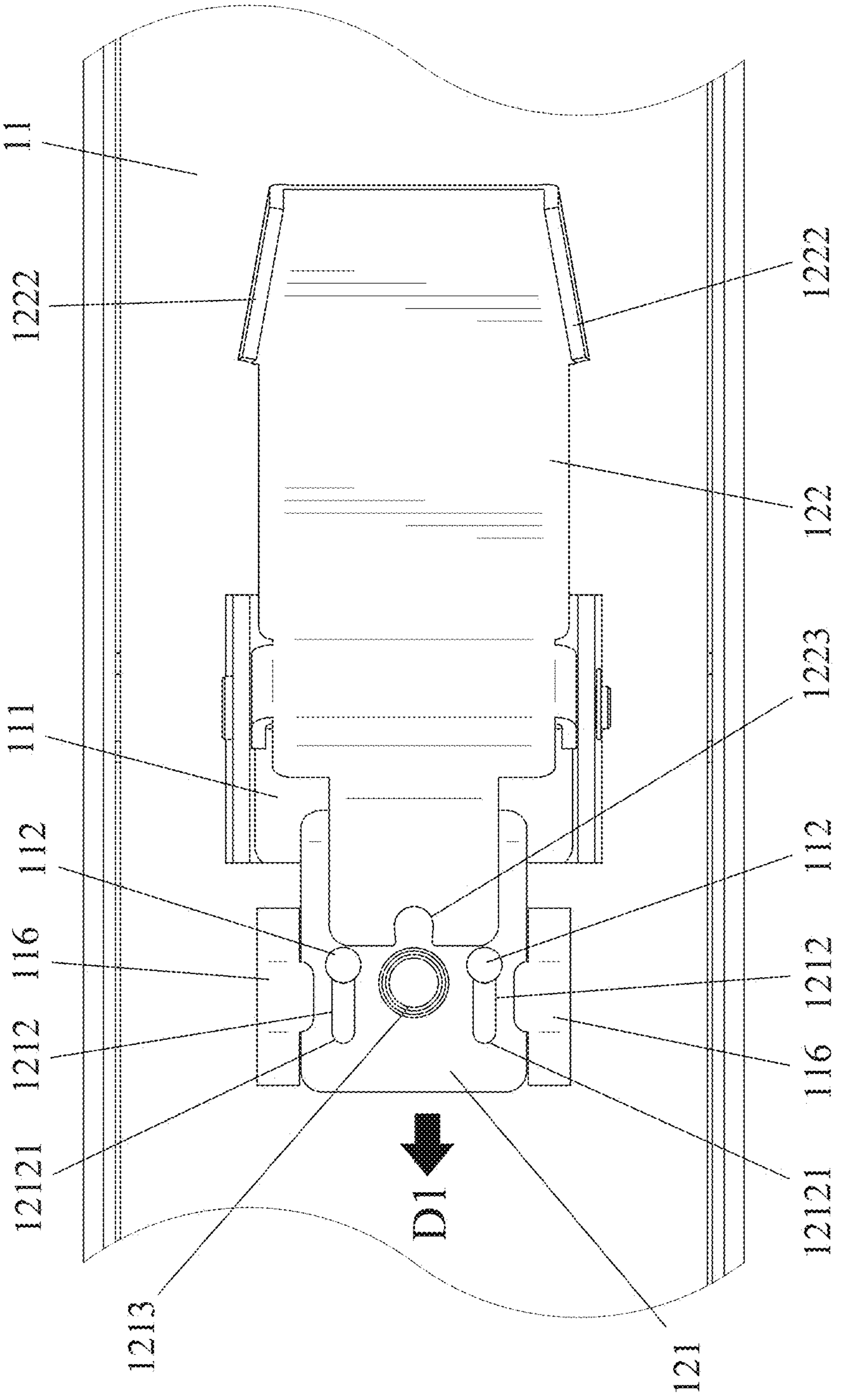
Figure 10:
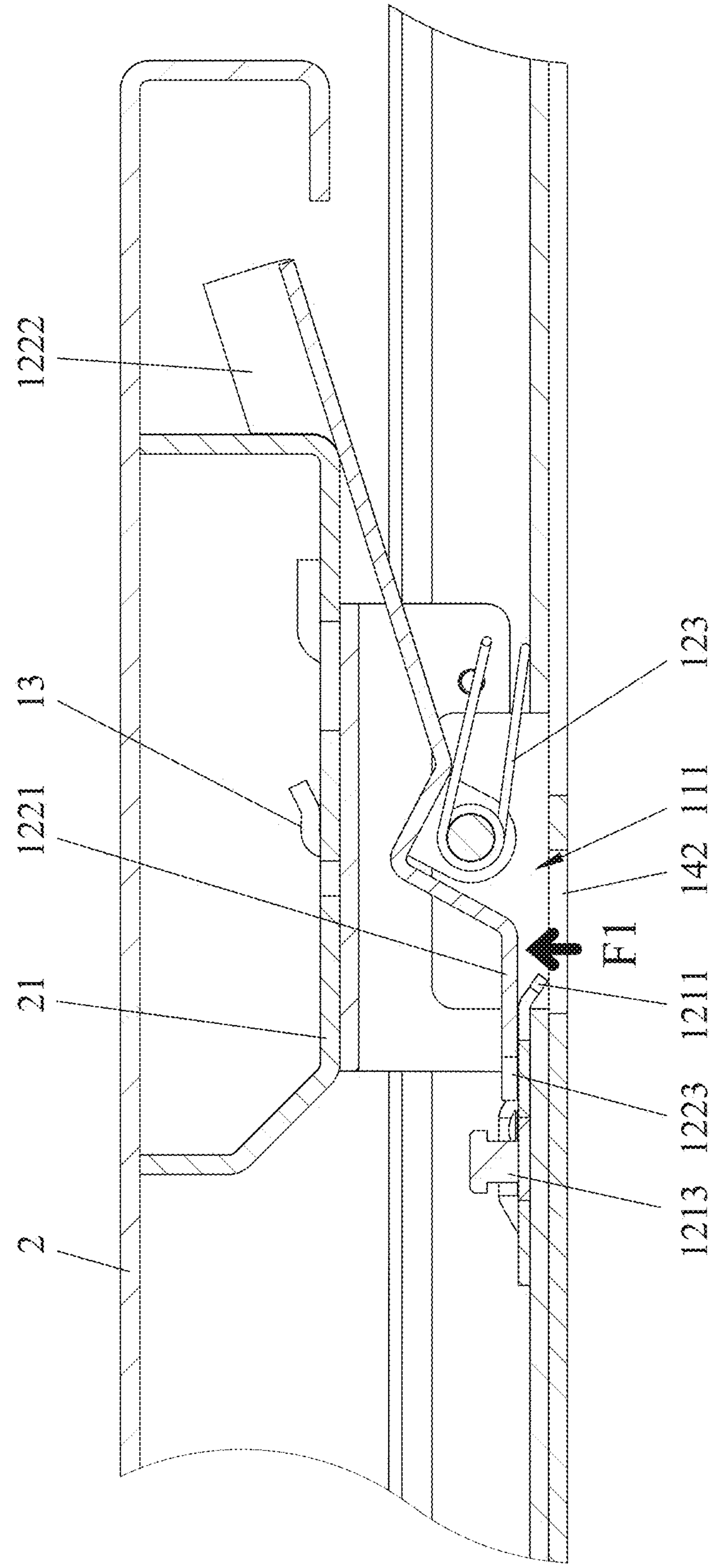
Figure 11:
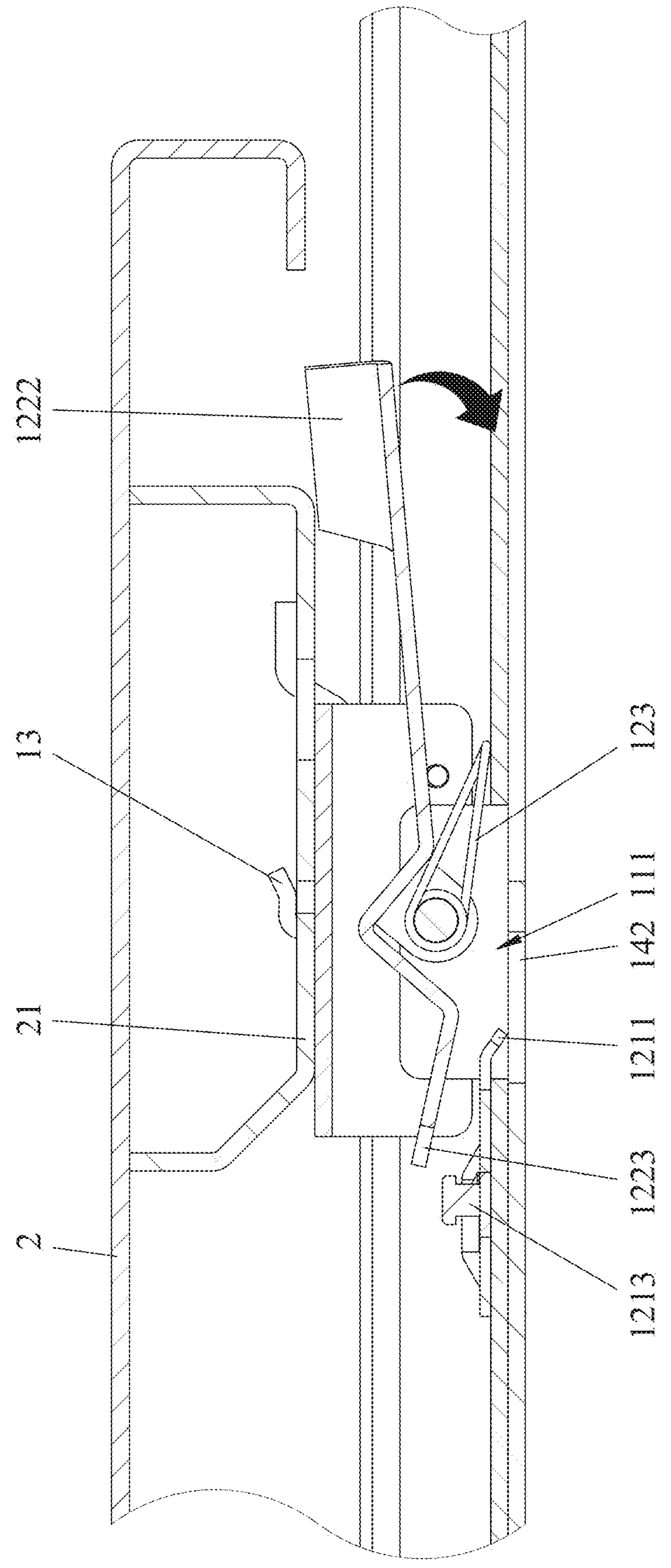
Figure 12:
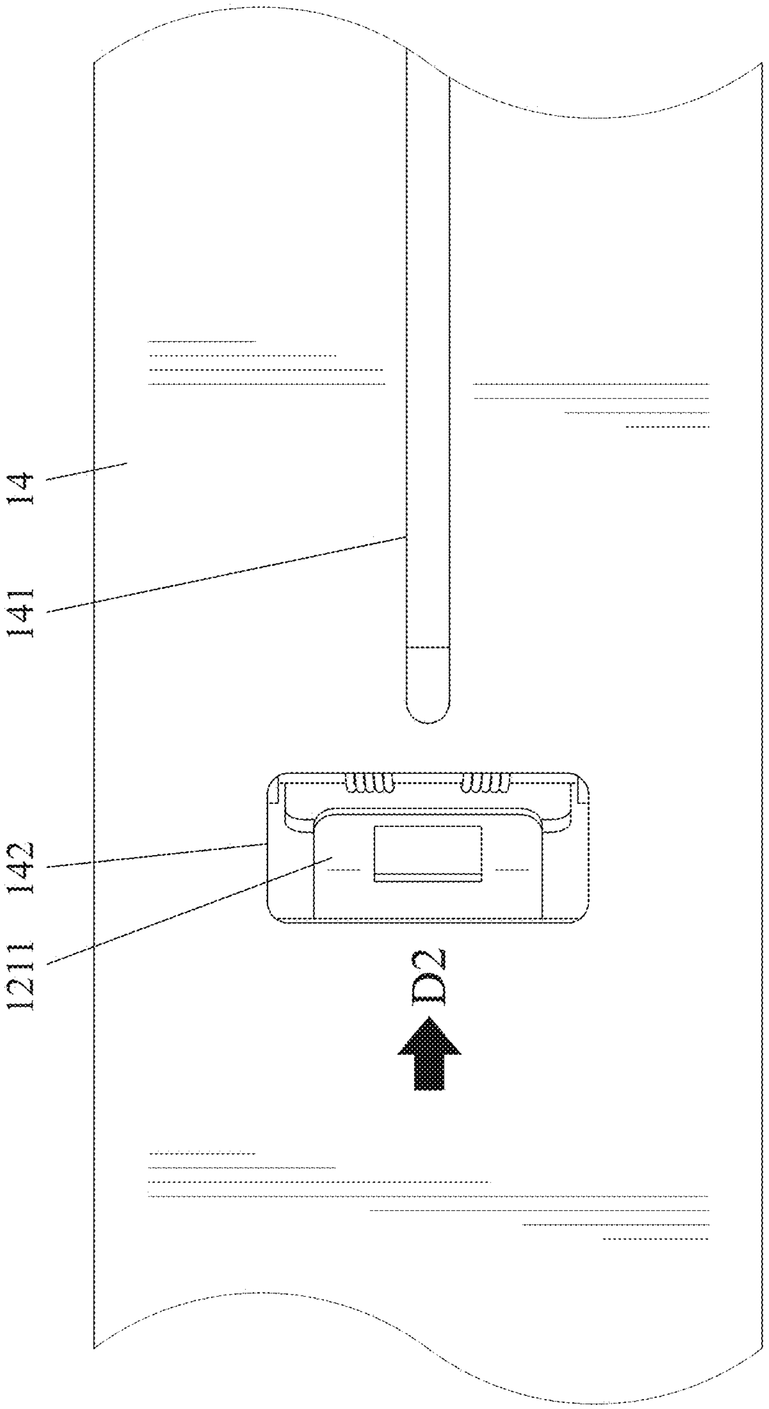
FIG. 12 and FIG. 13 are schematic diagrams showing the operation of the support device of the present invention being installed on a rack.
Figure 13:
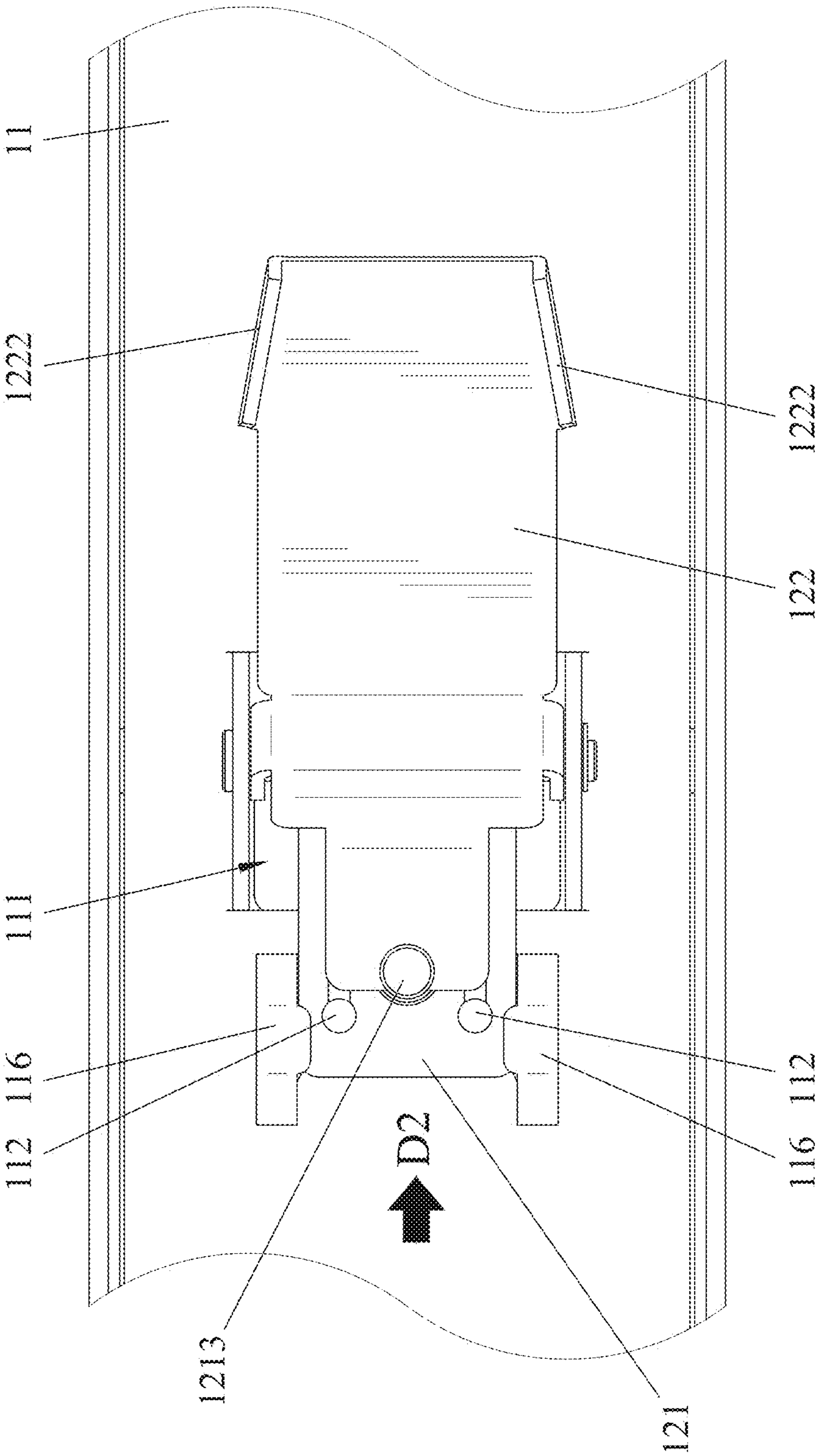

Please refer to FIGS. 2, 7 and 15 at the same time. The first embodiment of the present invention is that the support device 1 comprises an adapter plate 11, a front bracket 14, a mounting member 15 and another mounting member 15. The second end 114 of the adapter plate 11 is assembled with one mounting member 15, the front bracket 14 covers one side of the first end 113 of the adapter plate 11, and the front bracket 14 is assembled with the other mounting member 15 at one end far from the second end 114 of the adapter plate 11. The adapter plate 11 is provided with a quick-release mechanism 12 on one side adjacent to the first end 113. The second embodiment of the present invention has two quick-release mechanisms 12, which is provided with another quick-release mechanism 12 (not shown in the figure), another hollow portion 111 (not shown in the figure) and another fixing member 13 on one side of the adapter plate 11 adjacent to the second end 114. The other quick-release mechanism 12 is located between the other hollow portion 111 and the other fixing member 13.

Figure 16:
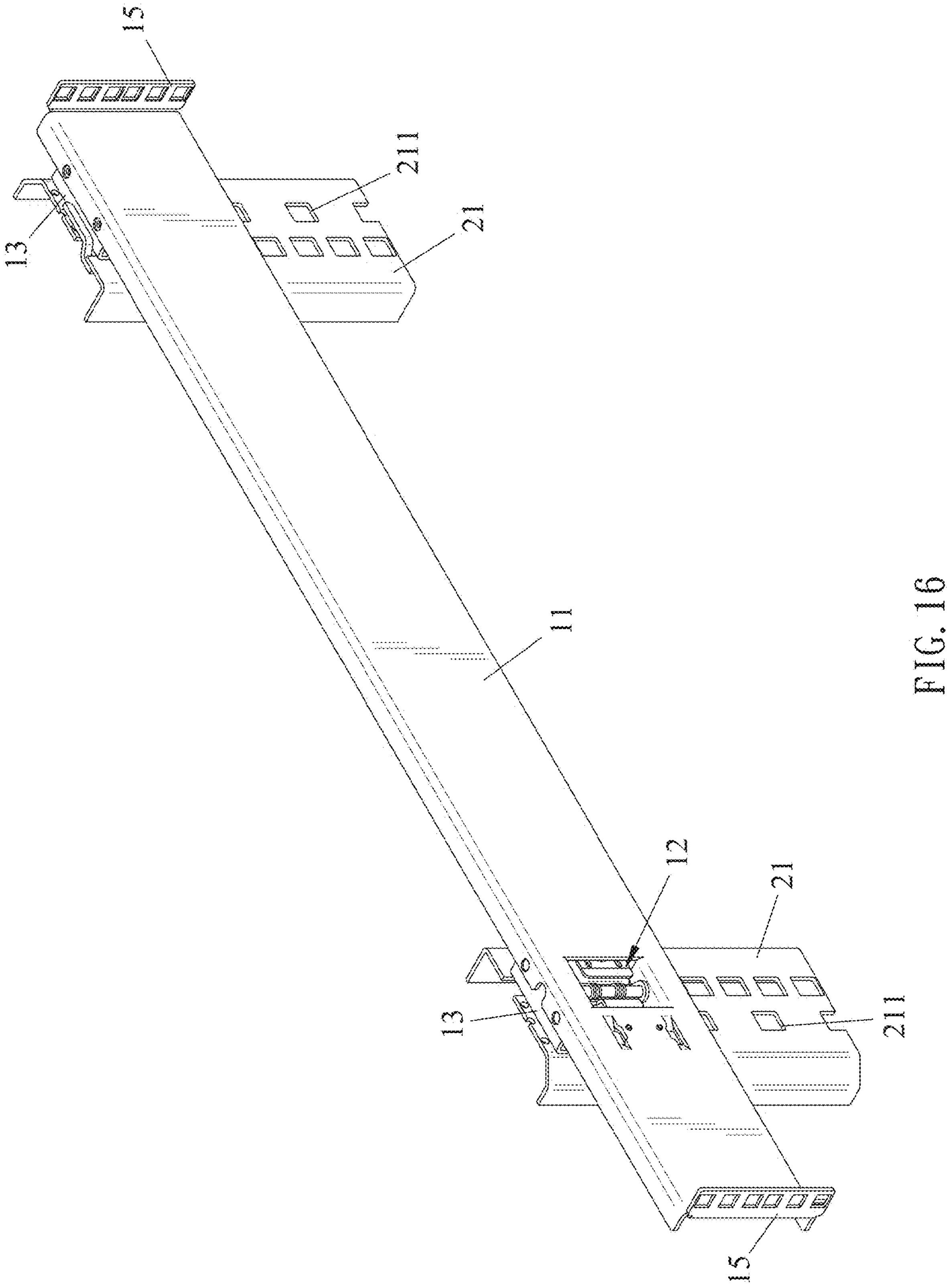
FIG. 16 is a three-dimensional schematic diagram showing that the support device may only include an adapter plate according to a third embodiment of the present invention.
Figure 17:
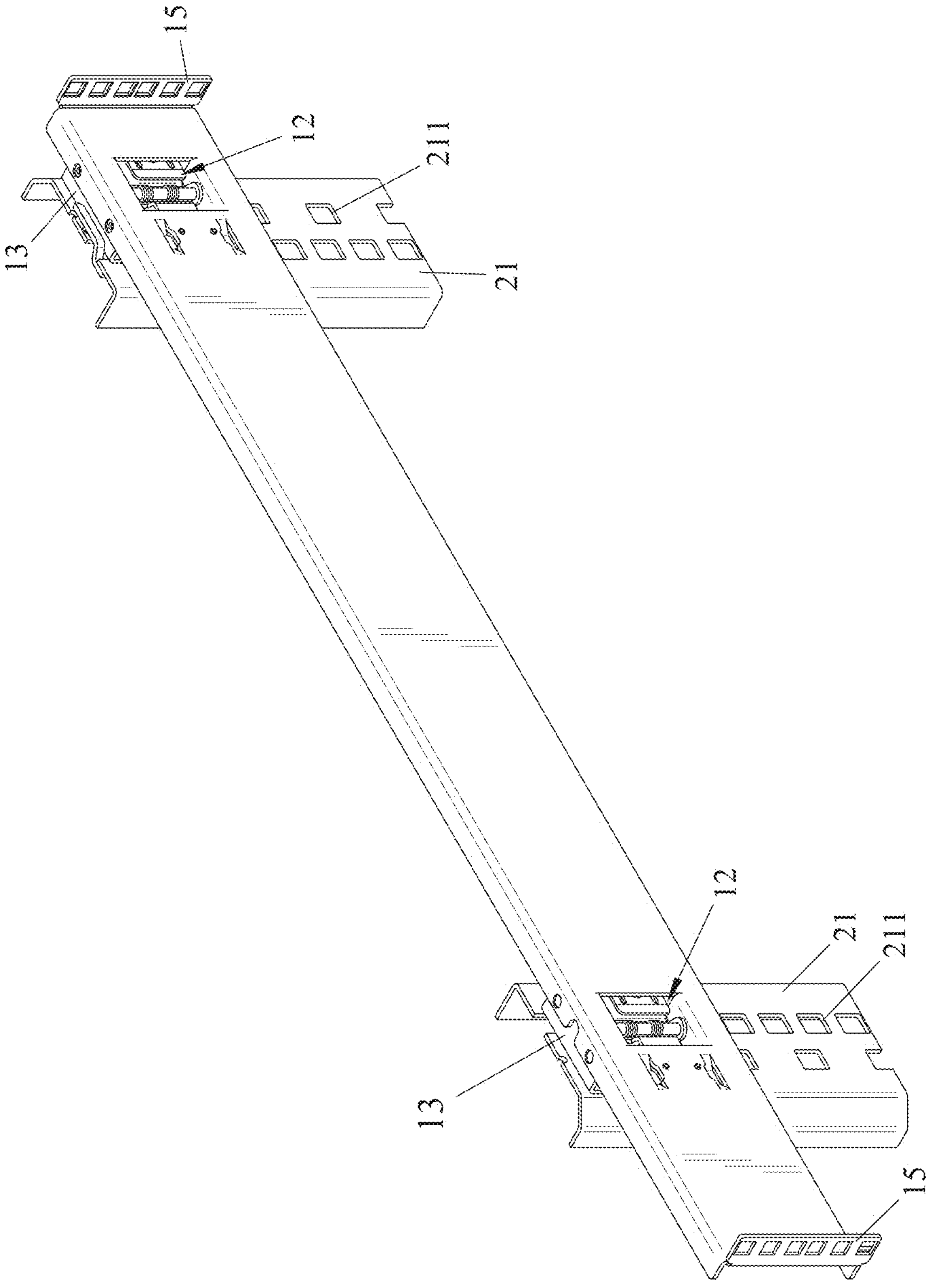
FIG. 17 is a three-dimensional schematic diagram of a support device having an adapter plate further provided with another quick-release mechanism, another hollow portion and another fixing member on one side adjacent to a second end according to a fourth embodiment of the present invention.

Please refer to FIG. 2, FIG. 16 and FIG. 17, the third embodiment of the present invention is that the support device 1 may only have the adapter plate 11, the two ends of the adapter plate 11 are respectively provided with a mounting member 15 and another mounting member 15, and the adapter plate 11 is provided with a quick-release mechanism 12 on one side adjacent to the first end 113 (please refer to the above description for other matching components or structures, which will not be elaborated here). The fourth embodiment of the present invention has two quick-release mechanisms 12, wherein another quick-release mechanism 12, another hollow portion 111 and another fixing member 13 are further provided on one side of the adapter plate 11 adjacent to the second end 114, and the other quick-release mechanism 12 is located between the other hollow portion 111 and the other fixing member 13.

In view of this, the support device 1 with a quick-release mechanism disclosed in the present invention can not only be easily assembled and disassembled from the rack 2, but also can be adapted to the slide rail assemblies 16 of different rack 2 specifications. By deflecting the fastener 122 of the quick-release mechanism 12 relative to the adapter plate 11, the fastener 122 is positioned or disengaged from the rack 2. The fixing member 13 is installed in the column hole 211 to increase the strength of the fastener 122 and the outer surface of the column 21 of the rack 2, and the convenience of the disconnection, and to stabilize the support device 1 for easy installation on the rack 2. In addition, by adjusting the front bracket 14 relative to the adapter plate 11, the mounting member 15 on the adapter plate 11 and the other mounting member 15 on the front bracket 14 are used to assemble slide rail assemblies 16 of different lengths. When installing the slide rail assembly 16, it is not necessary to install a separate assembly (not shown in the figure) on the rack 2, and the rack 2 and the slide rail assembly 16 can be adapted to different specifications.

What is claimed is:

1. A quick-release mechanism equipped support device, comprising:

- an adapter plate comprising a hollow portion formed therein, a first end, a second end and a mounting member assembled at said second end;
- a fixing member disposed on said adapter plate;
- a front bracket covering one side of said first end side of said adapter plate and displaceable relative to said adapter plate, said front bracket comprising a second mounting member assembled at a location away from said second end said adapter plate; and
- a quick-release mechanism comprising a stop member movably set on said adapter plate and a fastener pivotally connected to said adapter plate and deflectable to engage or disengage with said stop member;
- wherein said mounting member and said second mounting member are used to assemble a preset slide rail assembly, and said front bracket is displaced relative to said adapter plate to adjust the length to be suitable for the preset slide rail assembly of different lengths.

2. The quick-release mechanism equipped support device as claimed in claim 1, wherein said adapter plate further comprises at least one locking member, and said front bracket comprises at least one rail groove for said at least one locking member to penetrate, so that said front bracket is movable to a predetermined position relative to said adapter plate to be locked and positioned.

3. The quick-release mechanism equipped support device as claimed in claim 1, wherein said quick-release mechanism further comprises an elastic member disposed between said fastener and said adapter plate and providing an elastic force to deflect said fastener relative to said adapter plate; said adapter plate further comprises a second quick-release mechanism, a second hollow portion and a second fixing member provided at one end thereof, said second quick-release mechanism being located between said second hollow portion and said second fixing member.

4. The quick-release mechanism equipped support device as claimed in claim 1, wherein said front bracket comprises an opening aligned with said hollow portion; said fastener comprises an operating portion and at least one bending portion respectively located at two opposite sides thereof, said operating portion being aligned with said hollow portion, said operating portion being subjected to a force to allow said fastener to deflect relative to said adapter plate, so that said at least one bending portion is movable to form a positioning or release positioning with said rack.

* * * * *